United States Patent
Dumoulin et al.

(10) Patent No.: US 7,777,485 B2
(45) Date of Patent: Aug. 17, 2010

(54) METHOD FOR MULTIPLEXED MR TRACKING

(75) Inventors: Charles Dumoulin, Ballston Lake, NY (US); Renee Guhde, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1037 days.

(21) Appl. No.: 11/504,192

(22) Filed: Aug. 15, 2006

(65) Prior Publication Data

US 2008/0097191 A1    Apr. 24, 2008

(51) Int. Cl.
G01V 3/00      (2006.01)
A61B 5/055    (2006.01)

(52) U.S. Cl. .................. 324/309; 600/411; 600/422; 600/423; 600/433; 324/318; 324/307

(58) Field of Classification Search ......... 324/300–322; 600/407–435
See application file for complete search history.

(56) References Cited

U.S. PATENT DOCUMENTS

| | | | |
|---|---|---|---|
| 2,888,638 A * | 5/1959 | Nelson et al. | ............... 324/314 |
| 2,922,947 A * | 1/1960 | Bloom et al. | ............... 324/322 |
| 3,530,371 A * | 9/1970 | Ernst et al. | ................... 324/313 |
| 4,680,546 A | 7/1987 | Dumoulin | |
| 4,727,324 A * | 2/1988 | Bendall et al. | ............... 324/309 |
| 5,038,783 A | 8/1991 | Dumoulin | |
| 5,211,165 A | 5/1993 | Dumoulin et al. | |
| 5,237,277 A | 8/1993 | Lenz | |
| 5,265,610 A | 11/1993 | Darrow et al. | |
| 5,271,400 A | 12/1993 | Dumoulin et al. | |
| 5,307,808 A | 5/1994 | Dumoulin et al. | |
| 5,318,025 A | 6/1994 | Dumoulin et al. | |
| 5,353,795 A | 10/1994 | Souza et al. | |
| 5,377,678 A | 1/1995 | Dumoulin et al. | |
| 5,443,066 A | 8/1995 | Dumoulin et al. | |
| 5,445,150 A | 8/1995 | Dumoulin et al. | |
| 5,577,502 A | 11/1996 | Darrow et al. | |
| 5,578,924 A | 11/1996 | Dumoulin et al. | |
| 5,671,739 A | 9/1997 | Darrow et al. | |
| 5,715,822 A | 2/1998 | Watkins et al. | |
| 5,730,129 A | 3/1998 | Darrow et al. | |
| 6,054,858 A | 4/2000 | Dumoulin et al. | |
| 6,184,684 B1 | 2/2001 | Dumoulin et al. | |
| 6,198,282 B1 | 3/2001 | Dumoulin | |
| 6,201,987 B1 | 3/2001 | Dumoulin | |
| 6,211,674 B1 | 4/2001 | Cline et al. | |

(Continued)

Primary Examiner—Brij B. Shrivastav
Assistant Examiner—Tiffany A Fetzner
(74) Attorney, Agent, or Firm—Fletcher Yoder PC (57) ABSTRACT

The present technique provides a novel method and apparatus for magnetic resonance device tracking. In one aspect of the present technique, a plurality of magnetic resonance tracking signals are acquired in response to a corresponding plurality of pulse sequences, wherein the plurality of magnetic resonance tracking signals are acquired from a tracking coil mounted in a device. A location value is also determined for each pulse sequence to produce a plurality of location values. Further, a candidate location value of the plurality of location values for replacement, an off-resonance error value for the plurality of magnetic resonance tracking signals, and a replacement location value based on the off-resonance error value are determined. The location of the device is also determined based on the plurality of location values, wherein the candidate location value was replaced in the plurality of location values with the replacement location value.

27 Claims, 7 Drawing Sheets

U.S. PATENT DOCUMENTS

| | | |
|---|---|---|
| 6,246,896 B1 | 6/2001 | Dumoulin et al. |
| 6,275,721 B1 | 8/2001 | Darrow et al. |
| 6,289,233 B1 | 9/2001 | Dumoulin et al. |
| 6,466,018 B1 | 10/2002 | Dumoulin et al. |
| 6,470,204 B1 | 10/2002 | Uzgiris et al. |
| 6,492,814 B1 | 12/2002 | Watkins et al. |
| 6,687,530 B2 | 2/2004 | Dumoulin |
| 6,995,560 B2 * | 2/2006 | Duerk et al. ............... 324/310 |
| 7,027,853 B2 | 4/2006 | Ma |
| 7,245,124 B2 * | 7/2007 | Shu et al. .................. 324/307 |
| 2003/0120146 A1 | 6/2003 | Dumoulin |
| 2004/0034297 A1 | 2/2004 | Darrow et al. |
| 2004/0171934 A1 | 9/2004 | Khan et al. |
| 2005/0054914 A1 | 3/2005 | Duerk et al. |
| 2005/0096534 A1 | 5/2005 | Zhu et al. |
| 2005/0218892 A1 | 10/2005 | Pruessmann et al. |
| 2006/0074296 A1 | 4/2006 | Dumoulin et al. |
| 2006/0226836 A1 * | 10/2006 | Shu et al. .................. 324/309 |
| 2008/0097191 A1 * | 4/2008 | Dumoulin et al. .......... 600/422 |

* cited by examiner

METHOD FOR MULTIPLEXED MR TRACKING

BACKGROUND

The invention relates generally to nuclear magnetic resonance imaging ("MRI"), and more particularly to a technique for using MRI to determine the location of a device being used in a surgical or medical procedure.

MRI systems have become ubiquitous in the field of medical diagnostics. In general, MRI systems are based on the interactions among a primary magnetic field, a radiofrequency (rf) field and time varying magnetic gradient fields with nuclear spins within the subject of interest. Specific nuclear components, such as hydrogen nuclei in water molecules, have characteristic behaviors in response to external magnetic fields. The precession of spins of such nuclear components can be influenced by manipulation of the fields to obtain rf signals that can be detected, processed, and used to reconstruct a useful image.

The magnetic fields used to produce images in MRI systems include a highly uniform, static magnetic field that is produced by a primary magnet. A series of gradient fields are produced by a set of three gradient coils disposed around the subject. The gradient fields encode positions of individual volume elements or voxels in three dimensions. A radiofrequency coil is employed to produce an rf field, typically pulsed to create the required resonance signals. This rf magnetic field perturbs the spin system from its equilibrium direction, causing the spins to process at desired phases and frequencies. During this precession, rf fields are emitted by the affected molecules and detected by either the same transmitting rf coil, or by a separate receive-only coil. These signals are amplified, filtered, and digitized. The digitized signals are then processed using one of several possible reconstruction algorithms to reconstruct a useful image.

Heretofore, MRI systems have also been employed to determine the location of a device (such as a catheter) during medical or surgical procedures. Such MR tracking systems employ small tracking coils attached to the device to be tracked. During these MR tracking procedures, signals are generated throughout the patient using the large transmitting rf coil, but are detected with the small tracking coils attached to the device. Locating the tracking coils is typically accomplished by acquiring the MR signal in the presence of the applied magnetic field gradient, Fourier transforming the signal, and identifying the position of the most intense frequency-domain signal.

Frequently, these tracking coils are almost fully immersed in MR signal generating fluids. This is particularly true for MR tracking catheters. Because the tracking coils detect signals from their entire surroundings, localization of the MR signal can be difficult when the data pixel size is smaller than that of the coil. Localization becomes even more difficult when the signal-to-noise ratio (SNR) is relatively low. Under these conditions the measured location of the tracking coil appears to hop around the true location of the coil since the local signal maximum varies both spatially and temporally.

One way to improve the precision of the location measurement is to increase the SNR of the acquisition. This can be done by 1) increasing the static magnetic field strength, 2) signal averaging, 3) using larger tracking coils and/or 4) changing the T1 of the MR signal source. Unfortunately, all of these remedies have implications for system cost, resolution (temporal and spatial), and clinical use.

Accordingly, there is a need for an improved technique for employing device tracking with an MRI system. Particularly, there is a need for a technique that determines device location while addressing the undesirable effects of poor signal quality.

BRIEF DESCRIPTION

The invention provides a novel technique that addresses the undesirable effects of poor signal on magnetic resonance device tracking, as well as other needs. In accordance with one aspect of the technique, a method is provided for determining the location of a device. The method includes acquiring a plurality of magnetic resonance tracking signals in response to a corresponding plurality of pulse sequences, wherein the plurality of magnetic resonance tracking signals are acquired from a tracking coil mounted in the device. The method further includes determining a location value for each pulse sequence to produce a plurality of location values, determining a candidate location value of the plurality of location values for replacement, determining an off-resonance error value for the plurality of magnetic resonance tracking signals, and determining a replacement location value based on the off-resonance error value. The method also includes determining the location of the device, based on the plurality of location values, wherein the candidate location value was replaced in the plurality of location values with the replacement location value.

In accordance of another aspect of the technique a method for magnetic resonance imaging and device tracking is provided. The method includes acquiring image data, and displaying an image of a patient anatomy based on the acquired image data. The method further includes acquiring a plurality of magnetic resonance tracking signals in response to a corresponding plurality of pulse sequences, wherein the plurality of magnetic resonance tracking signals are acquired from a tracking coil mounted in a device, determining a location value for each pulse sequence to produce a plurality of location values, determining a candidate location value of the plurality of location values for replacement, determining an off-resonance error value for the plurality of magnetic resonance tracking signals, and determining a replacement location value based on the off-resonance error value. The method also includes determining the location of the device based on the plurality of location values, wherein the candidate location value was replaced in the plurality of location values with the replacement location value, and indicating the location of the device on the displayed image of the patient's anatomy.

In accordance with another aspect of the present technique a magnetic resonance tracking system is provided. The magnetic resonance tracking system includes a scanner comprising a primary magnet coil for generating a magnetic field, a plurality of gradient coils for producing gradient fields, and a radiofrequency coil for generating radiofrequency pulses within the magnetic field. The magnetic resonance tracking system further includes a device comprising an operative end for positioning within the magnetic field, and a tracking coil mounted in the device for sensing magnetic resonance signals, wherein the magnetic resonance signals are generated in response to the radiofrequency pulses generated by the radiofrequency coil. Moreover, the magnetic resonance tracking system also includes a control circuit configured to determine a plurality of location values for a plurality of the magnetic resonance signals, determine a candidate location value of the plurality of location values for replacement, determine an off-resonance error value for the plurality of magnetic resonance tracking signals, determine a replacement location value based on the off-resonance error value, and determine the location of the device based on the plurality of location values, wherein the candidate location value was replaced in the plurality of location values with the replacement location value.

In accordance with yet another aspect of the technique, a computer program, stored on a computer readable medium, is provided for determining the location of a device. The computer program is constructed and arranged to determine a plurality of location values for a corresponding plurality of magnetic resonance tracking signals, the magnetic resonance tracking signals being acquired from a tracking coil mounted in the device. The computer program is further constructed and arranged to determine a candidate location value of the plurality of location values for replacement; determine an off-resonance error value for the plurality of magnetic resonance tracking signals, determine a replacement location value based on the off-resonance error value, and determine the location of the device based on the plurality of location values, wherein the candidate location value is replaced in the plurality of location values with the replacement location value.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF SPECIFIC EMBODIMENTS

Figure 1:
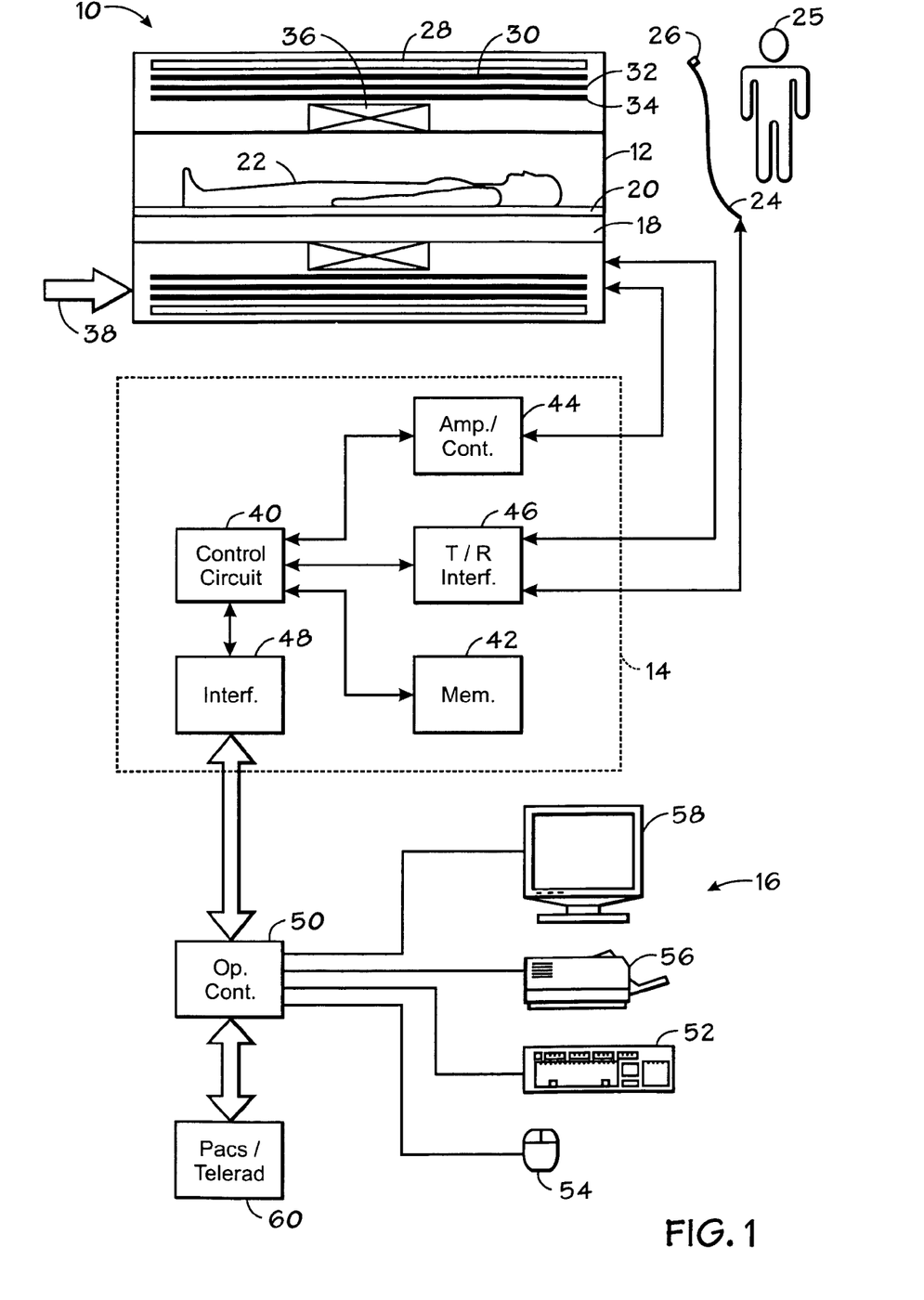
FIG. 1 is a diagrammatical representation of an MRI system for use in medical diagnostic imaging and implementing certain aspects of the present MR tracking technique.

Turning now to the drawings, and referring first to FIG. 1, an MRI system 10 suitable for MR tracking is illustrated diagrammatically as including a scanner 12, scanner control circuitry 14, and operator interface station 16. While MRI system 10 may include any suitable MRI scanner or detector, in the illustrated embodiment the system includes a full body scanner comprising a patient bore 18 into which a table 20 may be positioned to place a patient 22 in a desired position for scanning. As illustrated in FIG. 1, a device 24 to be tracked may be inserted into patient 22 by an operator 25.

Device 24 may be may be any suitable device for use in a medical or surgical procedure. For example, device 24 may be a guide wire, a catheter, an endoscope, a laparoscope, a biopsy needle, an ablation device or other similar devices. Non-invasive devices, such as external coils used in tracking, are also within the scope of the present embodiments. As illustrated, device 24 includes an rf tracking coil 26 for receiving emissions from gyromagnetic material. Tracking coil 26 is mounted, for example, in the operative end of the device 24. Tracking coil 26 also may serve as a transmitting coil for generating radio frequency pulses for exciting the gyromagnetic material. Thus, tracking coil 26 may be coupled with driving and receiving circuitry in passive and active modes for receiving emissions from the gyromagnetic material and for applying rf excitation pulses, respectively.

Referring again to MRI system 10, scanner 12 includes a series of associated coils for producing controlled magnetic fields, for generating rf excitation pulses, and for detecting emissions from gyromagnetic material within the patient in response to such pulses. In the diagrammatical view of FIG. 1, a primary magnet coil 28 is provided for generating a primary magnetic field generally aligned with patient bore 18. A series of gradient coils 30, 32 and 34 are grouped in a coil assembly for generating controlled magnetic gradient fields during examination sequences as described more fully below. A radiofrequency coil 36 is provided for generating rf pulses for exciting the gyromagnetic material. In the embodiment illustrated in FIG. 1, rf coil 36 also serves as a receiving coil. Thus, rf coil 36 may be coupled with driving and receiving circuitry in passive and active modes for receiving emissions from the gyromagnetic material and for applying radiofrequency excitation pulses, respectively. Alternatively, various configurations of receiving coils may be provided separate from rf coil 36. Such coils may include structures specifically adapted for target anatomies, such as head coil assemblies, and so forth. Moreover, receiving coils may be provided in any suitable physical configuration, including phased array coils, and so forth.

In a present configuration, the gradient coils 30, 32 and 34 have different physical configurations adapted to their function in the imaging system 10. As will be appreciated by those skilled in the art, the coils are comprised of conductive wires, bars or plates which are wound or cut to form a coil structure which generates a gradient field upon application of controlled pulses as described below. The placement of the coils within the gradient coil assembly may be done in several different orders, but in the present embodiment, a Z-axis coil is positioned at an innermost location, and is formed generally as a solenoid-like structure which has relatively little impact on the rf magnetic field. Thus, in the illustrated embodiment, gradient coil 34 is the Z-axis solenoid coil, while coils 30 and 32 are Y-axis and X-axis coils respectively.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the magnetic resonance-active nuclei in the tissue partially align with the field. While a net magnetic moment is produced in the direction of the polarizing field, the randomly oriented components of the moment in a perpendicular plane generally cancel one another. During an examination sequence, an rf frequency pulse is generated at or near the Larmor frequency of the material of interest, resulting in rotation of the net aligned moment to produce a net transverse magnetic moment. This transverse magnetic moment processes around the main magnetic field direction, emitting rf (magnetic resonance) signals. For reconstruction of the desired images, these rf signals are detected by scanner 20 and processed. For location of device 24, these rf signals are detected by rf tracking coil 26 mounted in device 24 and processed.

Gradient coils 30, 32 and 34 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging and tracking process. For imaging, some of these functions are slice selection, frequency encoding and phase encoding. These functions can be applied along the X-, Y- and Z-axis of the original physical coordinate system or in various physical directions determined by combinations of pulsed currents applied to the individual field coils.

The coils of scanner 12 are controlled by scanner control circuitry 14 to generate the desired magnetic field and rf pulses. In the diagrammatical view of FIG. 1, control circuitry 14 thus includes a control circuit 40 for commanding the pulse sequences employed during the examinations, and for processing received signals. For example, control circuit 40 applies analytical routines to the signals collected in response to the rf excitation pulses to reconstruct the desired images and to determine device location. Control circuit 40 may include any suitable programmable logic device, such as a CPU or digital signal processor of a general purpose or application-specific determiner. Control circuitry 14 further includes memory circuitry 42, such as volatile and non-volatile memory devices for storing physical and logical axis configuration parameters, examination pulse sequence descriptions, acquired image data, acquired tracking data, programming routines, and so forth, used during the examination sequences implemented by scanner 12.

Interface between the control circuit 40 and the coils of scanner 12 and device 24 is managed by amplification and control circuitry 44 and by transmission and receive interface circuitry 46. Circuitry 44 includes amplifiers for each gradient field coil to supply drive current to the field coils in response to control signals from control circuit 40. Interface circuitry 46 includes additional amplification circuitry for driving rf coil 36. Moreover, where the rf coil 36 serves both to emit the radiofrequency excitation pulses and to receive MR signals, circuitry 46 will typically include a switching device for toggling the rf coil 36 between active or transmitting mode, and passive or receiving mode. Interface circuitry 46 further includes pre-amplification circuitry to amplify the signals received by rf tracking coil 26 mounted in device 24. Furthermore, where rf tracking coil 26 serves as both a transmitting coil and a receiving coil, circuitry 46 will typically include a switching device for toggling rf tracking coil 26 between active or transmitting mode, and passive or receiving mode. A power supply, denoted generally by reference numeral 38 in FIG. 1, is provided for energizing the primary magnet 28. Finally, circuitry 14 includes interface components 48 for exchanging configuration and image and tracking data with operator interface station 16.

It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means. Additionally, while FIG. 1 illustrates a closed MRI system, the embodiments of the present invention are applicable in an open MRI system which is designed to allow access by a physician.

Operator interface station 16 may include a wide range of devices for facilitating interface between an operator or radiologist and scanner 12 via scanner control circuitry 14. In the illustrated embodiment, for example, an operator controller 50 is provided in the form of a determiner work station employing a general purpose or application-specific determiner. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional determiner keyboard 52 and an alternative input device such as a mouse 54. A printer 56 is provided for generating hard copy output of documents and images reconstructed from the acquired data. A determiner monitor 58 is provided for facilitating operator interface. In addition, system 10 may include various local and remote image access and examination control devices, represented generally by reference numeral 60 in FIG. 1. Such devices may include picture archiving and communication systems, teleradiology systems, and the like.

Figure 2:
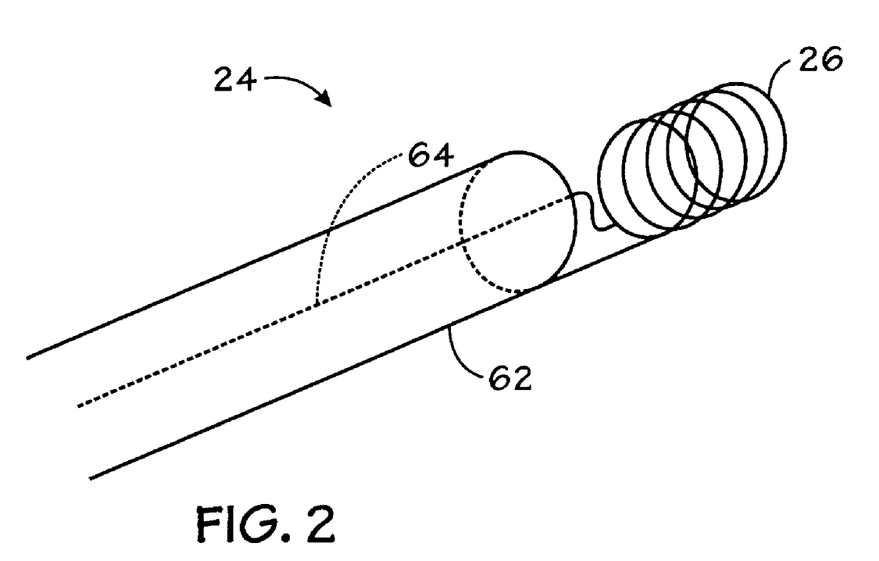
FIG. 2 is a schematic representation of an exemplary tracking coil.

Referring now to FIG. 2, the device 24 designed for insertion into a subject 22 includes a small rf tracking coil 26. As illustrated, the rf tracking coil 26 may be mounted in the operative end of the device 24. The device 24 may be any suitable device for use in a medical or surgical procedure. Since the tracking coil 26 is typically small in comparison to rf coil 36, its region of sensitivity is likewise small, and it generally only picks up MR signals from excited spins in its immediate vicinity. These MR signals are coupled to the scanned control circuitry 14 in the MRI system by a pair of coaxial conductors 62, 64. These conductors are typically encased along with the tracking coil 26 in an outer shell (not shown) of the medical device 24.

Furthermore, it should also be noted that, in certain embodiments, the tracking coil 26 located within device 24 performs a receive function. Alternatively, tracking coil 26 may be used to transmit rf energy and the rf coil 36 may be used to receive the MR response signal. In yet another embodiment, tracking coil 26 may be used to alternatively transmit and receive rf energy.

Figure 3:
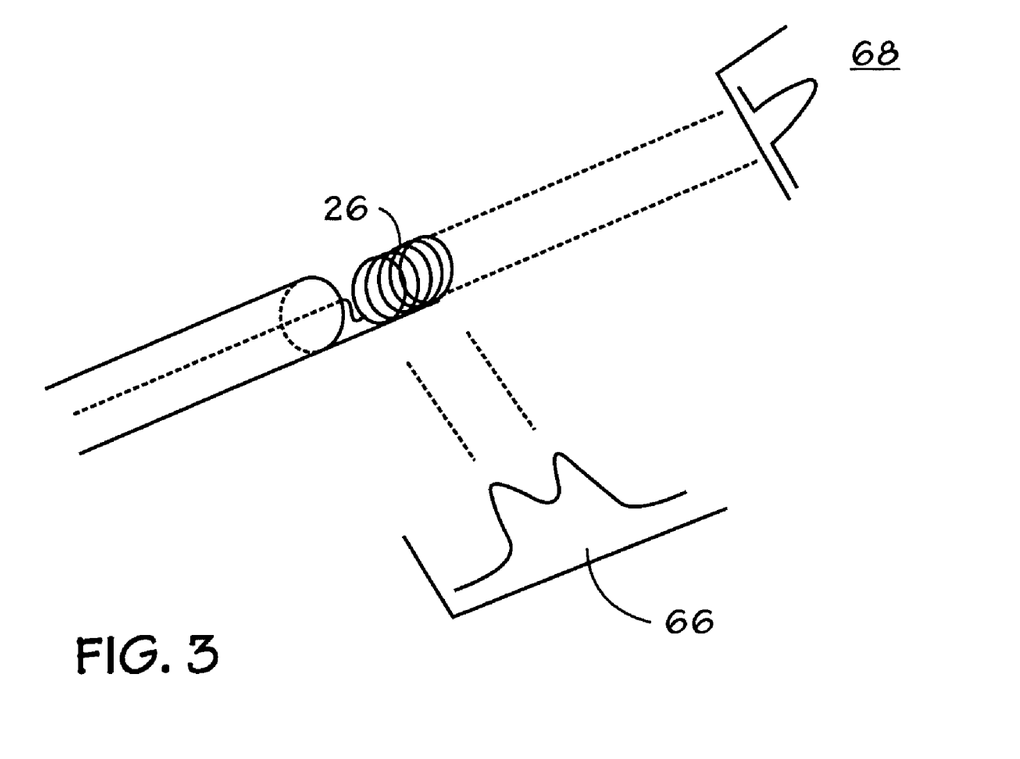
FIG. 3 is a schematic representation of an exemplary tracking coil and associated sensitivity profile.

As illustrated by FIG. 2, rf tracking coil 26 has a solenoid geometry and a relatively well characterized sensitivity profile. When the tracking coil 26 is used, however, the distribution of the signal detected by the coil 26 is highly dependent upon the orientation of the coil 26 with respect to each of the applied magnetic field gradients. The radial and axial sensitivity profiles of a typical tracking coil, such as tracking coil 26, are shown in FIG. 3 at 66 and 68, respectively. Note that when the spatial-encoding gradient is applied along the length of the tracking coil, a complicated sensitivity profile 66 is obtained. Conventional tracking algorithms will then generally select the location of maximum pixel intensity as the location of the coil.

Figure 5:
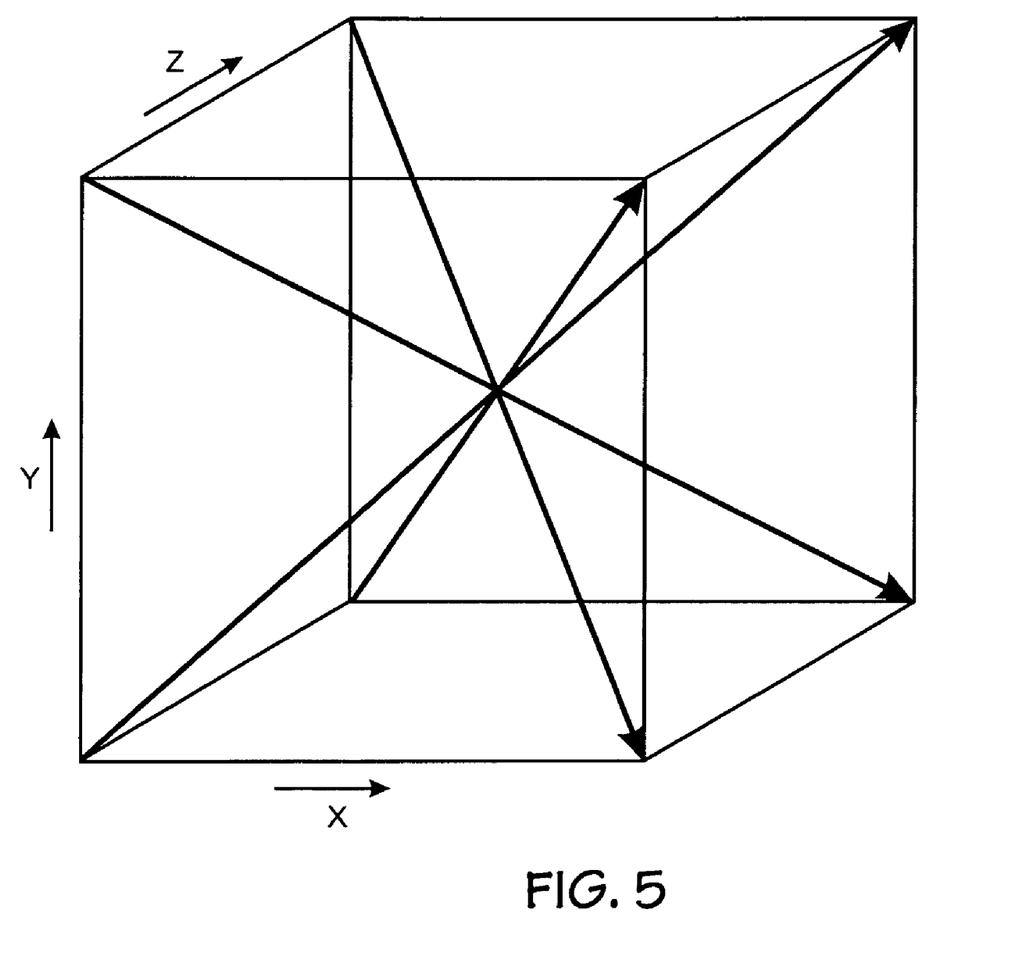
FIG. 5 is a schematic representation illustrating the relative orientation of the spatial-encoding magnetic field gradients in a Hadamard multiplexed MR tracking procedure.

It is to be appreciated that no a priori assumption can be made about the orientation of the tracking coil, such as rf tracking coil 26. For example, during a medical or surgical procedure, the orientation of the coil typically varies. Thus, it is desirable for the tracking system to be capable of tracking the coil in any orientation. Furthermore, as discussed above, MR tracking is performed by acquiring data in response to multiple magnetic field gradient pulses. In the most widely used method, four excitations, each with a different spatial encoding gradient direction are employed and the resulting data is decoded using a system of linear equations (Hadamard de-multiplexing) to extract out the X, Y and Z coordinates of the coil. The relative geometry of these magnetic field gradients is shown in FIG. 5. Consequently, for every orientation of the tracking coil 24, there will be at least one excitation in which the MR signal profile is sub-optimal and has a profile similar to that shown in the sensitivity profile 66 of FIG. 3.

Figure 4:
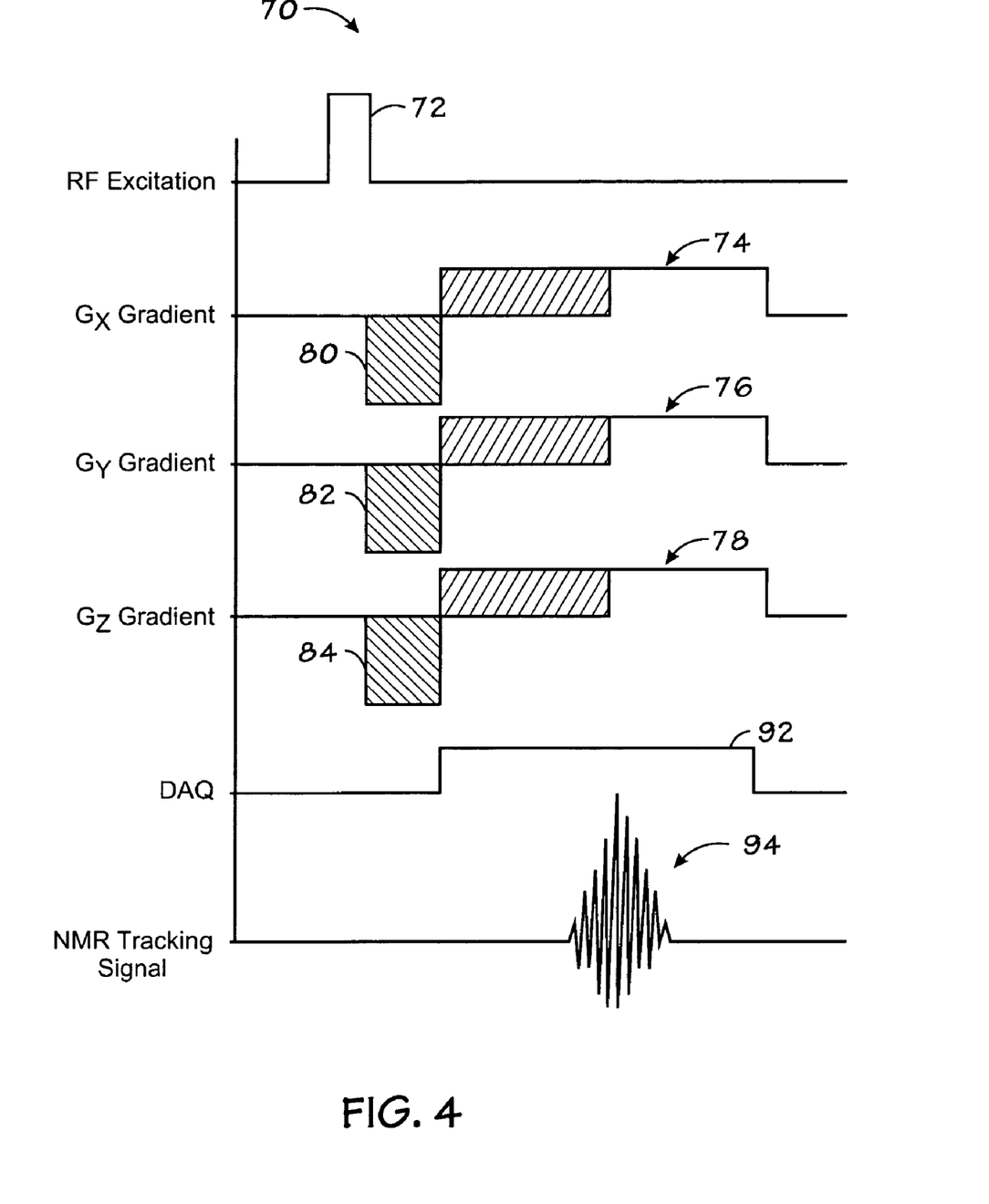
FIG. 4 is a graphical representation of an exemplary pulse sequence for an MRI tracking procedure which may be implemented in the system of FIG. 1.

The position of tracking coil 26 relative to the gradient iso-center may be determined using a Hadamard MR tracking pulse sequence. By way of example, FIG. 4 illustrates a Hadamard MR tracking pulse sequence, indicated generally by reference number 70. While many different tracking pulse sequences may be used, in example of FIG. 4, the tracking pulse sequence 70 is generally defined by a series of rf excitation pulses and magnetic field gradient pulses on the logical axis of the MRI system 10 appropriately timed with respect to one another. As illustrated, the tracking pulse sequence 70 is thus defined by an rf excitation pulse 72, and three readout gradient pulses 74, 76 and 78 applied on the respective $G_x$, $G_y$ and $G_z$ gradient axes. This tracking pulse sequence 70 yields a signal that is essentially a Fourier transform of a projection of the coil location. To acquire a complete data set, the pulse sequence description 70 may be repeated a desired number of times to include a series of excitation pulses and corresponding magnetic field gradient pulse. For example, the device location may be determined after a set of N tracking pulse sequences have been performed, where N is an integer equal to or greater than 3 because a minimum of three independent data acquisitions are required to determine the unknown coordinates of tracking coil 26 in three dimensions.

In general, the tracking pulse sequence 70 begins with a non-selective rf excitation pulse 72. This rf excitation pulse 72 is applied to the rf coil 36 of MRI system 10. It has a selected flip angle, for example, between 10 and 60 degrees, and it produces transverse magnetization in spins located throughout the magnet bore. Alternatively, the excitation pulse 72 could be weakly selective, for example, applied in the presence of a gradient pulse to excite a relatively large volume of patent 22. Three readout gradient pulses 74, 76 and 78 are then applied to produce a gradient recalled MR echo signal. Each of the readout gradient pulses 74-78 is preceded by a respective de-phase lobe 80, 82 and 84. As indicated by the cross-hatching, the area of each de-phasing lobe 80-84 is equal to one-half the area of the respective readout lobes 74, 76 and 78. Control Circuitry 40 controls the switching device during the data acquisition window 92 to receive an MR tracking signal 94 from the tracking coil 26.

In a typical Hadamard MR tracking pulse sequence, the tracking pulse sequence description 70 may be repeated N times with different polarity gradient pulses 74-78 for each corresponding rf excitation pulse 72. Those of ordinary skill in the art will appreciate that the polarity of the gradient pulses 74-78 is modulated to modulate the phase of transverse magnetization created by rf excitation pulse 72. For example, tracking pulse sequence 70 may be performed a total of four times with the polarity of the $G_x$, $G_y$ and $G_z$ gradient pulses selectively reversed as set forth in Table 1. The relative geometry of these magnetic field gradients is shown in FIG. 5.

TABLE 1

|  | $G_x$ | $G_y$ | $G_z$ |
|---|---|---|---|
| Pulse Sequence 1 | − | − | − |
| Pulse Sequence 2 | + | + | − |
| Pulse Sequence 3 | + | − | + |
| Pulse Sequence 4 | − | + | + |

As will be appreciated by those skilled in the art, a great number of variations may be devised for Hadamard MR tracking pulse sequences employing the exemplary gradient pulse functions described above, as well as other gradient pulse functions not explicitly described here.

Figure 6:
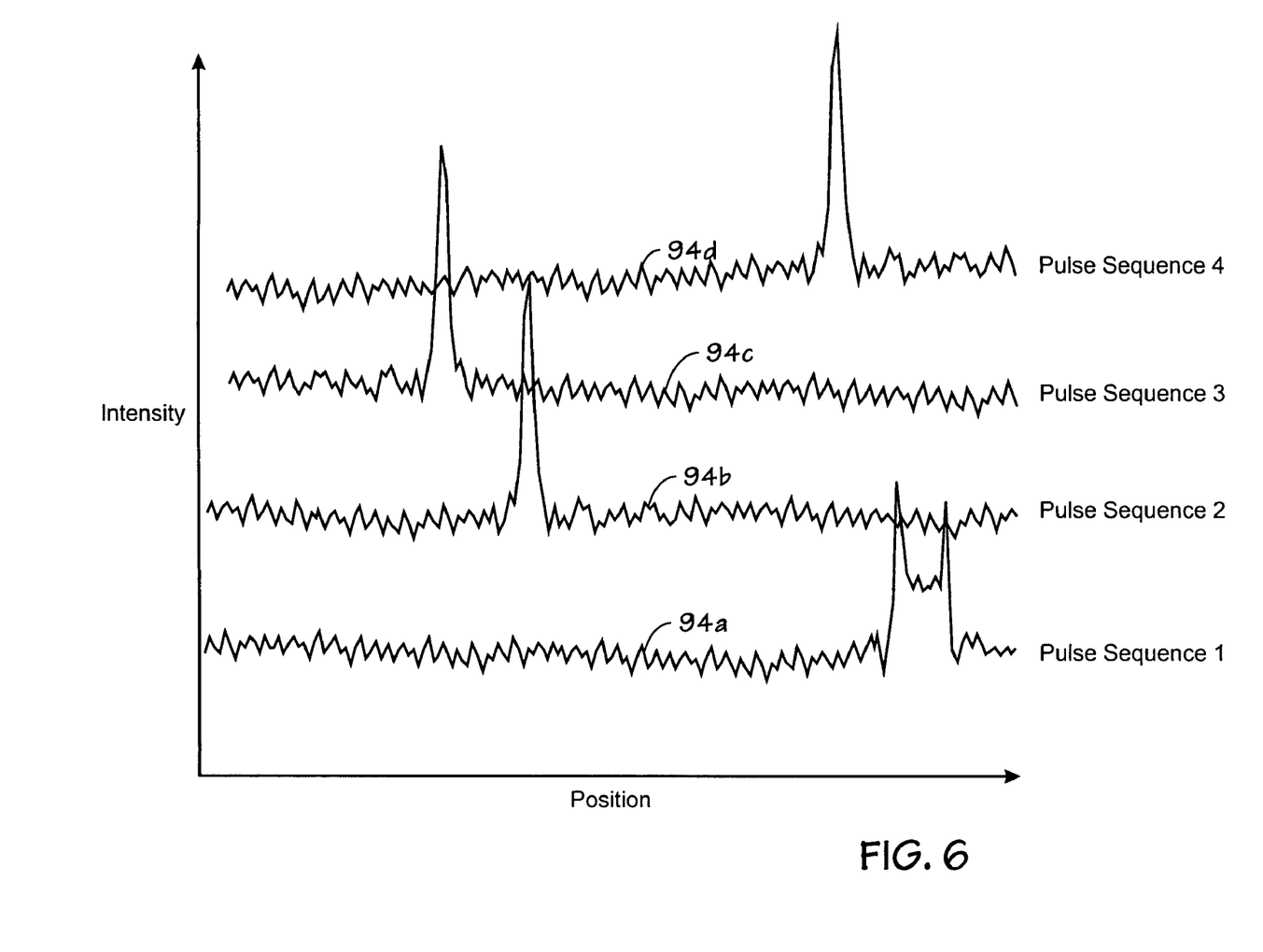
FIG. 6 is a line graph of MR signals acquired during a typical Hadamard MR tracking sequence.

FIG. 6 illustrates the MR tracking signals obtained for each of the four pulse sequences discussed above. The MR tracking signals are represented as 94a, 94b, 94c, and 94d for each pulse sequence, respectively. The illustrated embodiment is a worst case profile of the tracking coil 26 in which the coil 26 is relatively large with respect to the field-of-view (FOV), and the projection is made along the axis of the tracking coil 26. With the conventional MR tracking algorithm, the maximum pixel intensity is identified and used to determine location of the coil.

However, as is evident from FIG. 6, the quality of the MR signal 94a for the first pulse sequence is poor, resulting in multiple peaks of high intensity. It should be noted that for a coil fully immersed in MR signal generating fluids, the location of maximum signal intensity occurs at one end of the coil. If the coil is constructed to give a higher signal at one end and not the other (e.g., by over-winding one end), then the location of the coil will be robustly determined. If the coil has a symmetric sensitivity profile, however, then small fluctuations in the signal due to noise may cause the detected coil location to hop between the two maxima.

As previously mentioned, conventional algorithms generally utilize the maximum pixel technique to select the maximum pixel intensity to determine the location of the tracking coil 26, or other tracking device. With sensitivity profiles such as sensitivity profile 66 in FIG. 3 and MR signal 94a in FIG. 6, there is a problem with a sub-optimal MR signal profile since there are two peaks of high intensity which can lead to undesirable jitter artifacts about the indication of the location of the device, such as device 24. To overcome the problem of a sub-optimal profile, a more sophisticated algorithm than the "maximum pixel" algorithm could be employed. For example, the acquired data could be fit to a parametric model of the sensitivity profile of a solenoid coil, but such an approach would be computationally intensive and probably marginal due to the number of parameters needed to define the fit.

An embodiment of the present invention provides a method for MR tracking to address the problem of a sub-optimal profile. The present technique is generally not computationally intensive and can be applied to all projections regardless of the orientation of the coil with respect to the applied magnetic field gradient.

Figure 7:
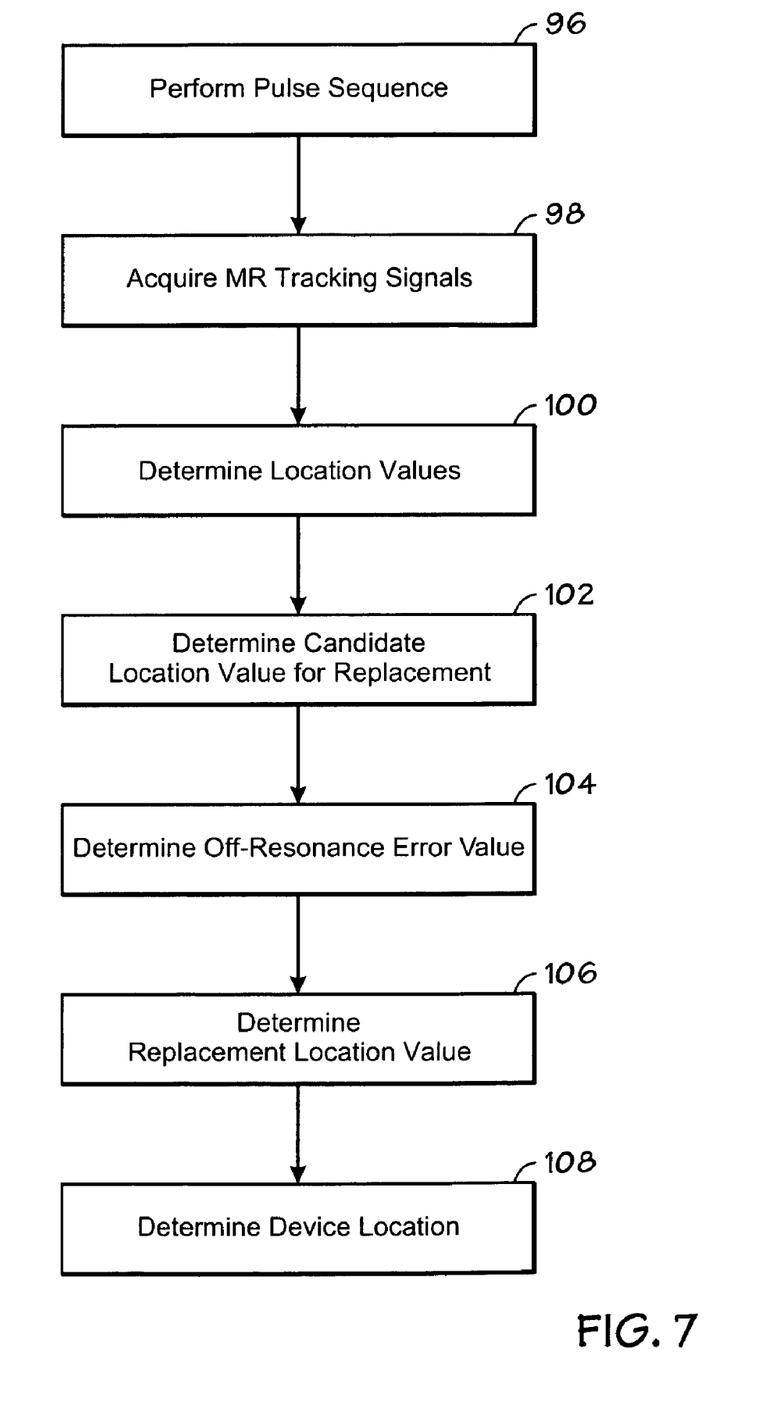
FIG. 7 is a block diagram of an example technique for determining the location of a device.

Referring now to FIG. 7, a flow chart depicting a method associated with aspects of the present technique is presented. A tracking pulse sequence, such as sequence 70 illustrated on FIG. 4, is first performed, as depicted in block 96. As discussed above, this tracking pulse sequence typically includes rf excitation pulses and magnetic field gradient pulses appropriately timed with respect to one another. To obtain sufficient data to determine the device location, a set of N tracking pulse sequences may be performed. In certain embodiments, a series of 4 pulse sequences may be performed.

In response to the pulse sequences, a plurality of MR tracking signals are acquired as depicted in block 98. The MR tracking signals may be detected by MR tracking coil 26. FIG. 6 illustrates MR signals 94a-94d acquired in response to a series of four pulse sequences.

Next, a location value of coil 26 for each of the pulse sequences is determined, as depicted in block 100. Determining the location value of coil 26 for each pulse sequence may be determined by various means, but typically will be accomplished by Fourier transforming the MR signals to produce four corresponding projections, denoted on FIG. 6 as 94a-94d and here denoted as $P_1$, $P_2$, $P_3$ and $P_4$. The location values $L_1$, $L_2$, $L_3$ and $L_4$ of coil 26 for each pulse sequence are derived from the location of the maximum signal intensity for each of the four projections $P_1$-$P_4$. Alternatively, determining the location value of coil 26 for each pulse sequence may include determining a centroid of signal intensity in a region centered about a location of maximum signal intensity for the MR signal for each pulse sequence, as described in U.S. Pat. No. 6,687,530, the disclosure of which is incorporated herein by reference. Other suitable techniques for determining the location value also may be utilized.

As those of ordinary skill in the art will appreciate, in conventional algorithms, the four location values $L_1$-$L_4$ are then combined using the following equations:

$$S_x = -L_1 + L_2 + L_3 - L_4 \quad (1)$$

$$S_y = -L_1 + L_2 - L_3 + L_4 \quad (2)$$

$$S_z = -L_1 - L_2 + L_3 + L_4 \quad (3)$$

wherein $S_x$, $S_y$ and $S_z$ are the x, y and z coordinates of tracking coil 26. A fourth equation provides the off-resonance error value. This error value represents all of the off-resonance components of the data (e.g., due to local field inhomogeneity).

$$\text{Error Value} = (L_1 + L_2 + L_3 + L_4)/4 \quad (4)$$

Due to the problems associated with a sub-optimal profile as discussed above, among other things, determining the coordinates of the tracking coil 26 using the four location values $L_1$-$L_4$ and equations (1)-(3) may generally result in undesirable jitter artifacts about the indication of device location. As such, rather than combining $L_1$-$L_4$ using equations (1)-(3), the present technique utilizes assumptions regarding the error value to replace the location value for the pulse sequence with the worst quality data. Determining a candidate location value for replacement and determining the off-resonance error value are depicted, respectively, in blocks 102 and 104.

In particular, a candidate location value for replacement is determined, as depicted in block 102 of FIG. 7. While the candidate location value for replacement may be determined by various means, the location value for the pulse sequence having the lowest quality data will typically be selected. Thus, the pulse sequence with the lowest quality data is generally ignored. Any suitable method for determining the pulse sequence having the lowest quality data may be used. For example, the pulse sequence with a tracking signal having the lowest maximum intensity may be selected as the pulse sequence with the lowest quality data. Since the integrated signal intensity should be the same for each of the pulse sequences, the signal with the lowest maximum intensity should be also have the greatest dispersion, and thus the most likely to result in poor localization. In an alternative embodiment of the present technique, the process for determining the candidate location value for replacement includes identifying the peak in the tracking signals for each pulse sequence and determining the width of the peak. The peak with the greatest width should result in poor localization, and thus the pulse sequence for the peak with the greatest width may be selected as the pulse sequence with the lowest quality data. Those of ordinary skill in the art will recognize that, in addition to those above, a variety of different algorithms may be used to determine the pulse sequence having the lowest quality data.

In addition, block 104 depicts the process of determining the off-resonance error value of the four MR signals 94a-94d. Because the present technique ignores the pulse sequence with the lowest quality data, equation (4) contains two unknowns, the error value itself and the location value for the ignored pulse sequence. Thus, equation (4) cannot be used to determine the error value. Rather, the off-resonance error value for each pulse sequence may be determined by various means. For example, in one embodiment, the error value may be assigned an assumed value of 0. Alternatively, a second MR tracking acquisition may be employed based upon a non-Hadamard multiplexing scheme to measure the error value. In this non-Hadamard multiplexing scheme, an additional MR tracking signal may be acquired in the absence of any gradient pulse. This MR signal may then be Fourier transformed, and the signal peak identified to determine a location value. Thereafter, this location value may be used in equation (4), together with the remaining three location values, to determine the error value. In a present implementation, this results in a 5-step (e.g., 4 Hadamard and one reference) acquisition. In yet another alternative, since the error value should be generally constant over time and with respect to tracking position (or at the worst vary slowly), equation (4) may be used to determine the error value over a plurality of sets of N tracking pulse sequences and using the average error value over these n sets as the error value for the present plurality of pulse sequences.

Thereafter, a replacement location value is determined based on the off-resonance error value, as depicted in block 106. The replacement location value is determined by solving equation (4) for the location value to be replaced. Accordingly, assuming that location value for the first pulse sequence is to be replaced, the replacement location value is determined using the following equation:

$$L_{r1} = (4 \times \text{Error Value}) - L_2 - L_3 - L_4 \quad (5)$$

wherein $L_{r1}$ is the replacement location value for the first pulse sequence, and $L_2$, $L_3$ and $L_2$ are the location values for the second, third, and fourth pulse sequences, respectively.

As depicted at block 108, the location of the device is then determined based on the plurality of location values $L_{r1}$, $L_2$, $L_3$, and $L_4$, wherein the candidate location value was replaced in the plurality of location values $L_1$, $L_2$, $L_3$, and $L_4$ with the replacement location value $L_{r1}$. The process of determining the location of the device typically includes combining the four location values $L_{r1}$, $L_2$, $L_3$, and $L_4$ using equations (1)-(3) listed above to obtain the X, Y and Z coordinates of tracking coil 26.

It should be noted that MR imaging and tracking can be performed using much of the same hardware, such as MR system 10 described above. Those of ordinary skill in the art will understand that the tracking can be interleaved with image acquisition. Alternatively, simultaneous tracking and imaging can be performed without interleaving by analyzing the gradient wave forms of an imaging procedure and the MR signal detected by rf tracking coil 26 to determine the location of device 24.

Figure 8:
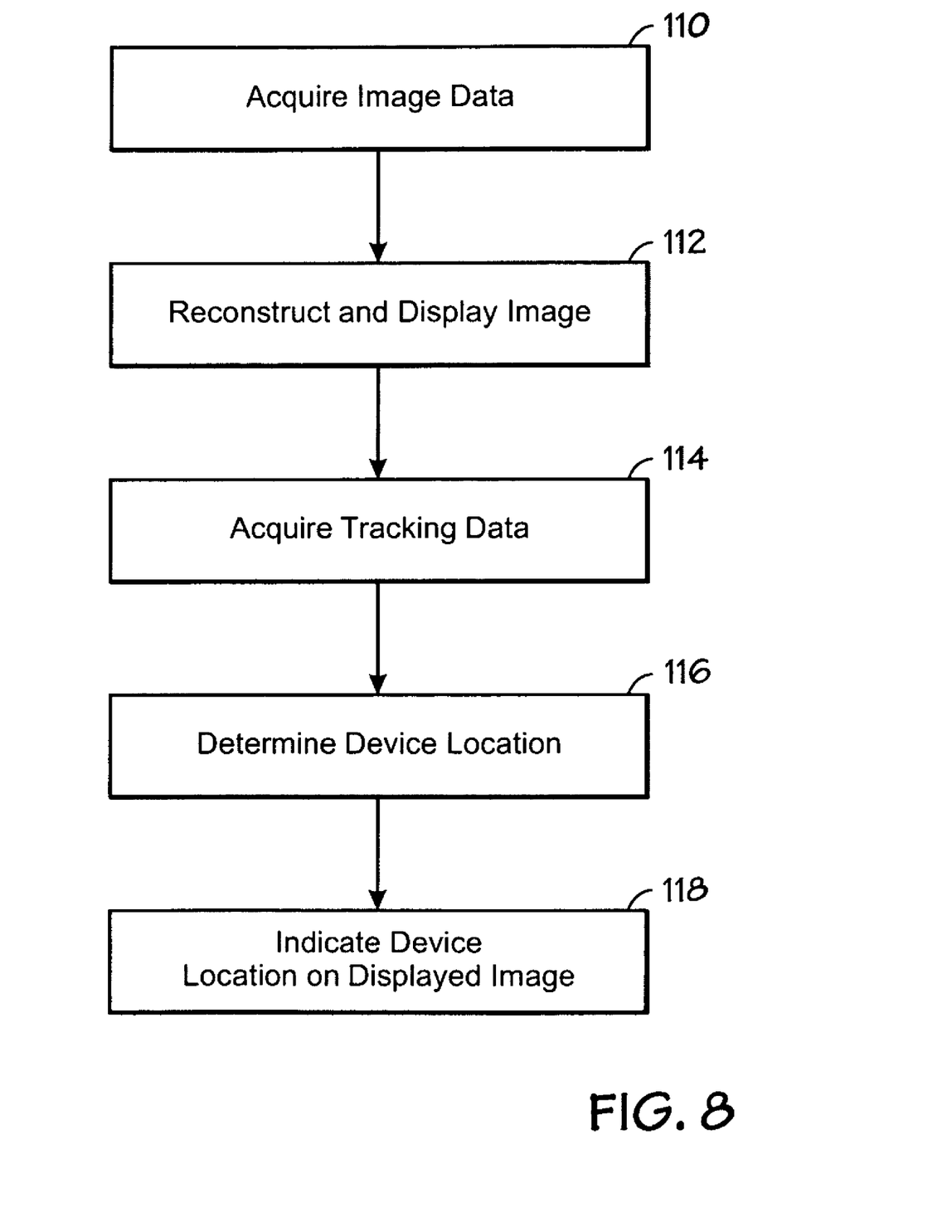
FIG. 8 is a block diagram of an example technique for using an MRI system for imaging and tracking.

Referring now to FIG. 8, a flow chart depicting a method for MR tracking and imaging is presented. As depicted in block 110, MRI system 10 acquires image data. Those of ordinary skill in the art will appreciate that this image data is acquired in response to a plurality of MR imaging pulse sequences. From this image data, as depicted by block 112, an image of patient anatomy can be reconstructed and displayed, for example, on determiner monitor 58. MR tracking data is acquired in response to a plurality of MR tracking pulse sequences, as depicted in block 114. An exemplary pulse sequence for acquiring tracking data is tracking pulse sequence 70 described above. From this MR tracking data, the position of device 24 is determined as depicted in block 116. The technique described above should be used to determine the location of tracking coil 26. Next, as indicated in block 118, an icon or image of device 24 is overlaid onto the image of the patient anatomy that was reconstructed and displayed. The icon is located on the image using the previously determined device location. The operator 25 then uses this image with the device icon overlaid thereon to guide device 24 to a desired location. In addition, the location of device 24 should continually be updated on monitor 58 as additional tracking data is acquired. As those of ordinary skill in the art will appreciate, the location of the device 24 may be updated based on additional tracking data acquired in response to one or more additional pulse sequences. Additionally, the image also may be updated as additional image data is acquired.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for determining a location of a device already located within a patient during a surgical procedure, comprising:
  acquiring a plurality of magnetic resonance tracking signals in response to a corresponding plurality of pulse sequences, wherein the plurality of magnetic resonance tracking signals are acquired from a tracking coil mounted in the device located within the patient during the surgical procedure;
  determining a location value of the tracking coil from the corresponding magnetic resonance tracking signal for each pulse sequence to produce a plurality of location values for the tracking coil;
  determining a candidate location value from the plurality of location values of the tracking coil for replacement;
  determining an off-resonance error value for each of the plurality of magnetic resonance tracking signals except the candidate location value;
  determining a replacement location value for the candidate location value based on the off-resonance error value of the plurality of magnetic resonance tracking signals as a whole; and
  determining the location of the device based on the plurality of location values for the tracking coil, wherein the candidate location value was replaced in the plurality of location values with the replacement location value, and wherein the device is located within the patient during the surgical procedure.

2. The method of claim 1, further comprising preforming the plurality of pulse sequences, wherein each pulse sequence comprises a radiofrequency excitation pulse and a plurality of gradient pulses.

3. The method of claim 1, wherein determining the location value for each pulse sequence comprises Fourier transforming the plurality of magnetic resonance tracking signals to produce a corresponding plurality of projections, wherein the signal peak of each projection is the location value for each pulse sequence.

4. The method of claim 1, wherein determining the location value for each pulse sequence comprises determining a centroid of signal intensity centered about a region of maximum signal intensity for each of the plurality of magnetic resonance tracking signals, wherein the centroid of signal intensity is the location value for each pulse sequence.

5. The method of claim 1, wherein candidate location value for replacement is the location value from the pulse sequence having the lowest quality data.

6. The method of claim 5, wherein the pulse sequence having the lowest quality data is the pulse sequence having a corresponding magnetic resonance tracking signal with the lowest maximum intensity when compared to the other of the plurality of magnetic resonance tracking signals.

7. The method of claim 5, wherein the pulse sequence having the lowest quality data is the pulse sequence having a corresponding magnetic resonance tracking signal with the widest signal peak when compared to the other of the plurality of the magnetic resonance tracking signals.

8. The method of claim 1, wherein determining the off-resonance error value comprises assigning the off-resonance error value a value of 0.

9. The method of claim 1, wherein determining the off-resonance error value comprises acquiring an additional magnetic resonance tracking signal in response to an additional pulse sequence that does not include a gradient pulse.

10. The method of claim 9, wherein determining the off-resonance error value comprises determining a location value for the additional magnetic resonance tracking signal.

11. The method of claim 10, wherein the off-resonance error value is calculated based on the location value from the additional magnetic resonance tracking signal and the location value for each pulse sequence, wherein the candidate location value for replacement is ignored.

12. The method of claim 10, wherein the plurality of pulse sequences comprises four pulse sequences, and wherein the off-resonance error value is calculated using the following equation:

$$\text{Error Value} = (L_1 + L_2 + L_3 + L_4)/4$$

wherein $L_1$, $L_2$, $L_3$ and $L_4$ are location values for the first, second, third and fourth pulse sequences, with $L_1$ being selected as representing the candidate location value, and wherein candidate location value, $L_1$, is replaced in this equation with the location value for the additional magnetic resonance tracking signal.

13. The method of claim 1, wherein determining the off-resonance error value comprises determining the average off-resonance error value over a set of pulse sequences, where the set of pulse sequences includes the plurality of pulse sequences.

14. The method of claim 1, wherein a replacement location value, $L_{R1}$, is determined for the candidate location value for replacement using the following equation:

$$L_{R1} = (4 \times \text{Error Value}) - L_2 - L_3 - L_4$$

wherein $L_2$, $L_3$ and $L_4$ are the location values for three of four pulse sequences, and wherein the three location values and the off-resonance error value are input into the equation to determine the replacement location value, $L_{R1}$.

15. The method of claim 1, wherein the plurality of pulse sequences comprises four pulse sequences, and wherein the location of the device is determined using the following equations:

$$S_x = -L_1 + L_2 + L_3 - L_4$$

$$S_y = -L_1 + L_2 - L_3 + L_4$$

$$S_z = -L_1 - L_2 + L_3 + L_4$$

wherein $S_x$, $S_y$ and $S_z$ are the x, y and z coordinates of tracking coil, and wherein $L_1$, $L_2$, $L_3$ and $L_4$ are the location values for the first, second, third and fourth pulse sequences.

16. The method of claim 1, further comprising displaying an image of the patient's anatomy, and further comprising indicating the location of the device on the image.

17. The method of claim 1, further comprising updating the location of the device based on one or more magnetic resonance imaging signals acquired in response to a corresponding one or more additional pulse sequences.

18. A method for magnetic resonance imaging and device tracking of a device already located within the patient during a surgical procedure, comprising:
   acquiring image data;
   displaying an image of a patient's anatomy based on the acquired image data;
   acquiring a plurality of magnetic resonance tracking signals in response to a corresponding plurality of pulse sequences, wherein the plurality of magnetic resonance tracking signals are acquired from a tracking coil mounted in the device located within the patient during the surgical procedure;
   determining a location value of the tracking coil from the corresponding magnetic resonance tracking signal for each pulse sequence to produce a plurality of location values for the tracking coil;
   determining a candidate location value from the plurality of location values of the tracking coil for replacement;
   determining an off-resonance error value for each of the plurality of magnetic resonance tracking signals except the candidate location value;
   determining a replacement location value for the candidate location value based on the off-resonance error value of the plurality of magnetic resonance tracking signals as a whole;
   determining the location of the device based on the plurality of location values for the tracking coil, wherein the candidate location value was replaced in the plurality of location values with the replacement location value, and wherein the device is located within the patient during the surgical procedure; and
   indicating the location of the device within the patient on the displayed image of the patient's anatomy.

19. The method of claim 18, wherein the candidate location value for replacement is the location value from the pulse sequence having the lowest quality data.

20. The method of claim 18, wherein the plurality of pulse sequences comprises four pulse sequences, and wherein the replacement location value, $L_{R1}$, is determined for the candidate location value for replacement using the following equation:

$$L_{R1} = (4 \times \text{Error Value}) - L_2 - L_3 - L_4$$

wherein $L_2$, $L_3$ and $L_4$ are the location values for three of four pulse sequences, and wherein the three location values and the off-resonance error value are input into the equation to determine the replacement location value, $L_{R1}$.

21. The method of claim 18, wherein the plurality of pulse sequences comprises four pulse sequences, and wherein the location of the device is determined using the following equations:

$$S_x = -L_1 + L_2 + L_3 - L_4$$

$$S_y = -L_1 + L_2 - L_3 + L_4$$

$$S_z = -L_1 - L_2 + L_3 + L_4$$

wherein $S_x$, $S_y$ and $S_z$ are the x, y and z coordinates of tracking coil, and wherein $L_1$, $L_2$, $L_3$ and $L_4$ are the location values for the first, second, third and fourth pulse sequences.

22. A magnetic resonance tracking system, comprising:
   a scanner comprising a primary magnet coil for generating a magnetic field, a plurality of gradient coils for producing gradient fields, and a radiofrequency coil for generating radiofrequency pulses within the magnetic field;
   a device comprising an operative end for positioning within the magnetic field, wherein the device is already located within a patient during a surgical procedure;
   a tracking coil mounted in the device located within the patient during the surgical procedure for sensing magnetic resonance signals, wherein the magnetic resonance signals are generated in response to the radiofrequency pulses generated by the radiofrequency coil; and
   a control circuit configured to determine a plurality of location values for the tracking coil for a corresponding plurality of the magnetic resonance signals, determine a candidate location value from the plurality of location values of the tracking coil for replacement, determine an off-resonance error value for each of the plurality of magnetic resonance signals except the candidate location value, determine a replacement location value based on the off-resonance error value of the plurality of magnetic resonance signals as a whole, and determine the location of the device based on the plurality of location values for the tracking coil, wherein the candidate location value was replaced in the plurality of location values with the replacement location value.

23. The magnetic resonance tracking system of claim 22, wherein the device is a guide wire, a catheter, an endoscope, a laparoscope, a biopsy needle, or an ablation device.

24. The magnetic resonance tracking system of claim 22, wherein the plurality of magnetic resonance signals comprises four magnetic resonance signals and wherein the control circuit is configured to determine the replacement location value, $L_{R1}$, that is then determined as the candidate location value for replacement using the following equation:

$$L_{R1} = (4 \times \text{Error Value}) - L_2 - L_3 - L_4$$

wherein $L_2$, $L_3$ and $L_4$ are the location values for three of four magnetic resonance signals, and wherein the three location values and the off-resonance error value are input into the equation to determine the replacement location value, $L_{R1}$.

25. The magnetic resonance tracking system of claim 22, wherein the plurality of magnetic resonance signals comprises four magnetic resonance signals, and wherein the control circuit is configured to determine the location of the device using the following equations:

$$S_x = -L_1 + L_2 + L_3 - L_4$$

$$S_y = -L_1 + L_2 - L_3 + L_4$$

$$S_z = -L_1 - L_2 + L_3 + L_4$$

wherein $S_x$, $S_y$ and $S_z$ are the x, y and z coordinates of tracking coil, and wherein $L_1$, $L_2$, $L_3$ and $L_4$ are the location values for the first, second, third and fourth magnetic resonance signals.

26. The magnetic resonance tracking system of claim 22, further comprising a display coupled to the control circuit for displaying the location of the device.

27. A computer program, stored on a computer readable medium, for determining the location of a device already located within a patient during a surgical procedure, the program constructed and arranged to:

determine a plurality of location values of a tracking coil for a corresponding plurality of magnetic resonance tracking signals, the magnetic resonance tracking signals being acquired from the tracking coil mounted in the device located within the patient during the surgical procedure;

determine a candidate location value from the plurality of location values of the tracking coil for replacement;

determine an off-resonance error value for each of the plurality of magnetic resonance tracking signals except the candidate location value;

determine a replacement location value for the candidate location value based on the off-resonance error value of the plurality of magnetic resonance tracking signals as a whole; and     determine the location of the device based on the plurality of location values for the tracking coil, wherein the candidate location value is replaced in the plurality of location values with the replacement location value.

* * * * *

UNITED STATES PATENT AND TRADEMARK OFFICE
CERTIFICATE OF CORRECTION

PATENT NO. : 7,777,485 B2                                                                                            Page 1 of 1
APPLICATION NO. : 11/504192
DATED : August 17, 2010
INVENTOR(S) : Dumoulin et al.

It is certified that error appears in the above-identified patent and that said Letters Patent is hereby corrected as shown below:

In Column 1, Line 30, delete "process" and insert -- precess --, therefor.

In Column 4, Line 62, delete "processes" and insert -- precesses --, therefor.

In Column 9, Line 12, delete "$P_4$" and insert -- $P_4.$ --, therefor.

In Column 10, Line 48, delete "$L_2$" and insert -- $L_4$ --, therefor.

Signed and Sealed this

Nineteenth Day of October, 2010

David J. Kappos
*Director of the United States Patent and Trademark Office*